(12) United States Patent
Koga et al.

(10) Patent No.: US 7,808,229 B2
(45) Date of Patent: Oct. 5, 2010

(54) MAGNETIC DEVICE AND FREQUENCY ANALYZER

(75) Inventors: Keiji Koga, Tokyo (JP); Yuji Kakinuma, Tokyo (JP)

(73) Assignee: TDK Corporation, Tokyo (JP)

( * ) Notice: Subject to any disclaimer, the term of this patent is extended or adjusted under 35 U.S.C. 154(b) by 5 days.

(21) Appl. No.: 12/000,171

(22) Filed: Dec. 10, 2007

(65) Prior Publication Data

US 2008/0180085 A1 Jul. 31, 2008

(30) Foreign Application Priority Data

Dec. 14, 2006 (JP) ............................. 2006-337399
Jul. 25, 2007 (JP) ............................. 2007-193737

(51) Int. Cl.
*G01R 15/20* (2006.01)
(52) U.S. Cl. ................................. 324/117 R
(58) Field of Classification Search ............. 324/117 R, 324/250
See application file for complete search history.

(56) References Cited

U.S. PATENT DOCUMENTS 6,256,863 B1 * 7/2001 Saito et al. ............... 29/603.08

2006/0062075 A1 * 3/2006 Koga et al. ................... 365/232
2006/0067008 A1 * 3/2006 Haratani ...................... 360/321
2008/0150643 A1 * 6/2008 Suzuki et al. ........... 331/107 R

OTHER PUBLICATIONS

A.A. Tulapurkar et al.; "Spin-Torque diode effect in magnetic tunnel junctions"; *Nature*; Nov. 17, 2005; pp. 339-342.

* cited by examiner

*Primary Examiner*—Ha Tran T Nguyen
*Assistant Examiner*—Shaun Campbell
(74) *Attorney, Agent, or Firm*—Oliff & Berridge, PLC

(57) ABSTRACT

A magnetic device and a frequency analyzer are provided as those industrially utilizing a resonance phenomenon of a direction of magnetization of a magnetoresistive element. Since polarities of an alternating current i vary with time, the direction of magnetization oscillates as affected by the magnitude and frequency of the alternating current. When the frequency $f_F$ of the direction of magnetization of a free layer in the magnetoresistive element coincides with the frequency f of the alternating current flowing in the magnetoresistive element, the oscillation of the direction of magnetization resonates to increase a voltage between output terminals. A magnetic yoke applies such a magnetic field as to cause resonance, to the free layer. A direct current is used as an electric current outputted from a current control circuit and, while this direct current is swept, voltages at respective specific resonance frequencies are detected by a monitor circuit.

7 Claims, 10 Drawing Sheets

Fig.8

| EXTERNAL MAGNETIC FIELD (Oe) | FREQUENCY (GHz) | | | | | |
|---|---|---|---|---|---|---|
| | 5.4 | 6.5 | 7.3 | 7.9 | 8.5 | 9.3 |
| 50 | 20 | | | | | |
| 100 | 50.2 | -1.9 | 4.1 | 4.1 | 3.2 | 4.7 |
| 200 | 13.9 | 55.6 | -1.9 | 1.9 | 4.5 | 5.3 |
| 300 | 10.4 | 10.8 | 55.3 | -4.8 | 0.7 | 2.8 |
| 400 | 9.6 | 7.9 | 1.9 | 54.1 | -4.8 | 1.1 |
| 500 | 9.6 | 8.7 | 6.6 | 2.3 | 50.3 | -3.6 |
| 600 | 9.6 | 10.4 | 8.7 | 7.5 | 4.5 | 46 |
| 700 | | | | | | 5.5 |

Fig.10

| CONTROL CURRENT (mA) | RESONANCE FREQUENCY (GHz) |
|---|---|
| 0.1 | 5.4 |
| 0.2 | 6.5 |
| 0.25 | 7.3 |
| 0.3 | 7.9 |
| 0.35 | 8.5 |
| 0.4 | 9.3 |

MAGNETIC DEVICE AND FREQUENCY ANALYZER

BACKGROUND OF THE INVENTION

1. Field of the Invention

The present invention relates to a magnetic device and a frequency analyzer.

2. Related Background Art

A conventionally known magnetoresistive element is a GMR (Giant Magnetoresistive) element in which a nonmagnetic electroconductive layer is interposed between a fixed layer with the direction of magnetization fixed, and a free layer with the direction of magnetization freely varying. Another known magnetoresistive element is a TMR (Tunnel Magnetoresistive) element in which a nonmagnetic insulating layer is interposed between the fixed layer and the free layer. When an electric current is allowed to flow through these magnetoresistive elements, a spin-polarized electric current flows to generate a torque by virtue of interaction with spins accumulated in the free layer, and the direction of magnetization of the free layer changes according to the polarities of the spin-polarized electric current. In a state where the free layer is located in a constant magnetic field and even in a case where the direction of magnetization is subject to change, the torque acts on the direction of magnetization so as to return it to the stable direction restrained by the magnetic field. The motion of the direction of magnetization is similar to swinging oscillation of a pendulum weight pulled by gravity and swayed by a specific force, and is called precession.

It was recently found that a resonance phenomenon occurs when the frequency of the precession of the direction of magnetization coincides with the frequency of the alternating current flowing through the free layer (cf. Non-patent Document 1). The magnetic resistance of the TMR element is determined by the difference between the direction of magnetization of the free layer and the direction of magnetization of the fixed layer. When the direction of magnetization resonates in the free layer, the direction of magnetization of the free layer largely oscillates and the magnetic resistance largely varies periodically. On the other hand, when the magnetic resistance largely varies in synchronization with the input alternating current, the alternating current flowing between the two ends of the TMR element asymmetrically varies with respect to the zero level and comes to have a direct current component, and the variation can be extracted as an output.

In order to cause the above-described phenomenon in the TMR element, it is necessary to apply a large magnetic field to the TMR element, and it is common practice to locate the TMR element in a magnetic-field applying device and perform experiments in that state. [Non-patent Document 1] Nature, Vol. 438, 17 Nov. 2005, pp. 339-342

SUMMARY OF THE INVENTION

However, while the phenomenon of the magnetoresistive element as described above is known, there are no known magnetic devices that can industrially utilize this phenomenon, and applications of the finding are expected.

The present invention has been accomplished in view of this problem and an object of the invention is to provide a magnetic device and a frequency analyzer industrially utilizing the resonance phenomenon of the direction of magnetization of the magnetoresistive element.

MEANS FOR SOLVING THE PROBLEM

In order to solve the above problem, a magnetic device according to the present invention comprises a magnetoresistive element; a magnetic yoke arranged to apply a magnetic field to the magnetoresistive element; a magnetic-field applying interconnection for applying the magnetic field through the magnetic yoke to a free layer of the magnetoresistive element; an input terminal for supplying an alternating-current signal to the magnetoresistive element; an output terminal for extracting an output voltage from the magnetoresistive element; and a current control circuit for controlling an electric current flowing through the magnetic-field applying interconnection.

When the frequency of the direction of magnetization of the free layer in the magnetoresistive element such as the GMR element or the TMR element coincides with the frequency of the alternating current flowing in the magnetoresistive element, the oscillation of the direction of magnetization resonates to rapidly vary the magnetic resistance and rapidly vary the output voltage. The resonance frequency increases depending upon the strength of the magnetic field applied to the magnetoresistive element. The strength of the magnetic field increases depending upon the electric current flowing through the magnetic-field applying interconnection. Therefore, the resonance frequency increases as the electric current flowing through the magnetic-field applying interconnection is increased by the current control circuit. Namely, the resonance frequency is determined depending upon the electric current for application of magnetic field, and a voltage of a signal of a specific frequency corresponding to a component of a determined resonance frequency is selectively outputted among the input alternating-current signal.

The magnetic device of this configuration is able to implement detection of GHz-band frequencies that cannot be achieved by the ordinary Si semiconductor technology, and thus enables industrial application. Particularly, the magnetic yoke is provided instead of the conventional large-scale magnetic-field applying device and thus achieves downsizing of the magnetic device.

The magnetic device is characterized in that the magnetoresistive element comprises: a fixed layer; a free layer; and a nonmagnetic layer interposed between the fixed layer and the free layer; and in that the alternating-current signal flows in a direction normal to a film plane of the magnetoresistive element. In this element the resonance phenomenon suitably occurs.

The magnetic device of the present invention is characterized in that a resonance frequency of the magnetoresistive element with the alternating-current signal is changed by controlling the electric current flowing through the magnetic-field applying interconnection. It was confirmed that the resonance frequency was controlled by controlling the electric current (control current) flowing in the magnetic-field applying interconnection. Namely, a specific frequency can be selected by the control current.

In other words, the magnetic device of the present invention is one for selecting a specific frequency component in the alternating-current signal by controlling the electric current flowing through the magnetic-field applying interconnection.

The magnetic device of the present invention is characterized in that direct-current voltages corresponding to a plurality of specific frequency components in the alternating-current signal are time-sequentially outputted by time-sequentially changing the electric current flowing through the magnetic-field applying interconnection. It was found by the inventor that the control current was proportional to the resonance frequency. Namely, direct-current voltages corresponding to respective frequency components can be time-sequentially outputted by linearly increasing or decreasing the control current by use of a ramp circuit or the like.

In order to oscillate the direction of magnetization of the free layer, the direction of the magnetic field is preferably not coincident with the direction of magnetization of the fixed layer. Namely, if they coincide, it is difficult to cause oscillation of the direction of magnetization of the free layer associated with the direction of magnetization of the fixed layer. When the axis of easy magnetization of the free layer is set in parallel with the direction of magnetization of the fixed layer, a relative relation between the direction of magnetization of the fixed layer and the direction of the magnetic field by the magnetic yoke coincides with a relative relation between the direction of magnetization along the easy magnetization axis of the free layer and the direction of the magnetic field by the magnetic yoke. Even in a case where the axis of easy magnetization of the free layer is set perpendicularly to the direction of magnetization of the fixed layer, the direction of the magnetic field by the magnetic yoke deviates from the stable axis of easy magnetization of the magnetization direction of the free layer, and it is thus feasible to cause the oscillation of the magnetization direction of the free layer.

In the magnetic device of the present invention, a relative location relation between the magnetic yoke and the magnetization direction of the fixed layer is determined so that the direction of the magnetic field applied to the magnetoresistive element by the magnetic yoke intersects at an angle of not less than 5° in the film plane, with the direction of magnetization of the fixed layer. The film plane is defined by a surface of each layer.

In cases where the direction of the magnetic field applied to the free layer by the magnetic yoke deviates from the film plane, "not less than 5°" means that an angle between a projection vector on the film plane of the direction of this magnetic field and the direction of magnetization of the fixed layer is not less than 5° in the film plane.

A frequency analyzer according to the present invention comprises the above-described magnetic device, and further comprises a monitor circuit for monitoring the voltage outputted from the output terminal, while sweeping a direct current outputted from the current control circuit.

As the direct current is used as the electric current outputted from the current control circuit, while this direct current is swept, voltages at specific resonance frequencies are detected by the monitor circuit. Namely, spectra of specific frequencies included in the alternating-current signal are obtained, and this device functions as a frequency analyzer.

The frequency analyzer of the present invention preferably further comprises a low-pass filter interposed between the monitor circuit and the magnetoresistive element. Since the alternating-current signal is applied between two ends of the magnetoresistive element, the low-pass filter is provided in order to selectively extract only the direct-current voltage according to the magnetic resistance (resonance frequency) of the magnetoresistive element. The low-pass filter transmits only the direct-current component from the magnetoresistive element and feeds it to the monitor circuit. A simple low-pass filter can be composed of a coil.

The magnetic device and frequency analyzer of the present invention enable industrial utilization of the resonance frequency of the direction of magnetization of the magnetoresistive element.

BRIEF DESCRIPTION OF THE DRAWINGS

FIG. 8 is a table showing data in the graph of FIG. 7.

FIG. 10 is a table showing data in the graph shown in FIG. 9.

DESCRIPTION OF THE PREFERRED EMBODIMENT

A magnetic device and a frequency analyzer according to an embodiment will be described below. The same elements will be denoted by the same reference symbols, without redundant description.

Figure 1:
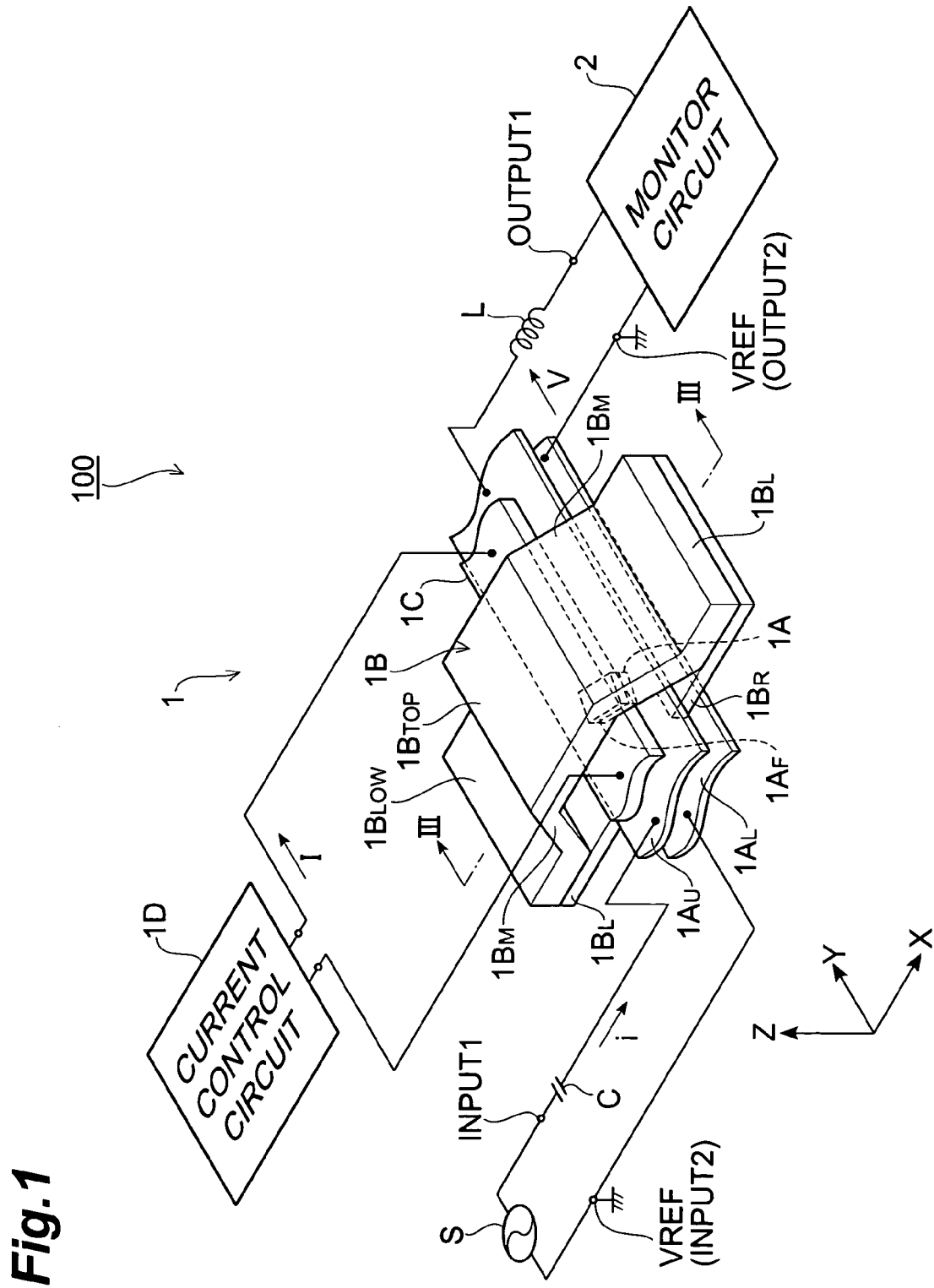
FIG. 1 is a perspective view of a frequency analyzer 100 with a magnetic device 1.
Figure 2:
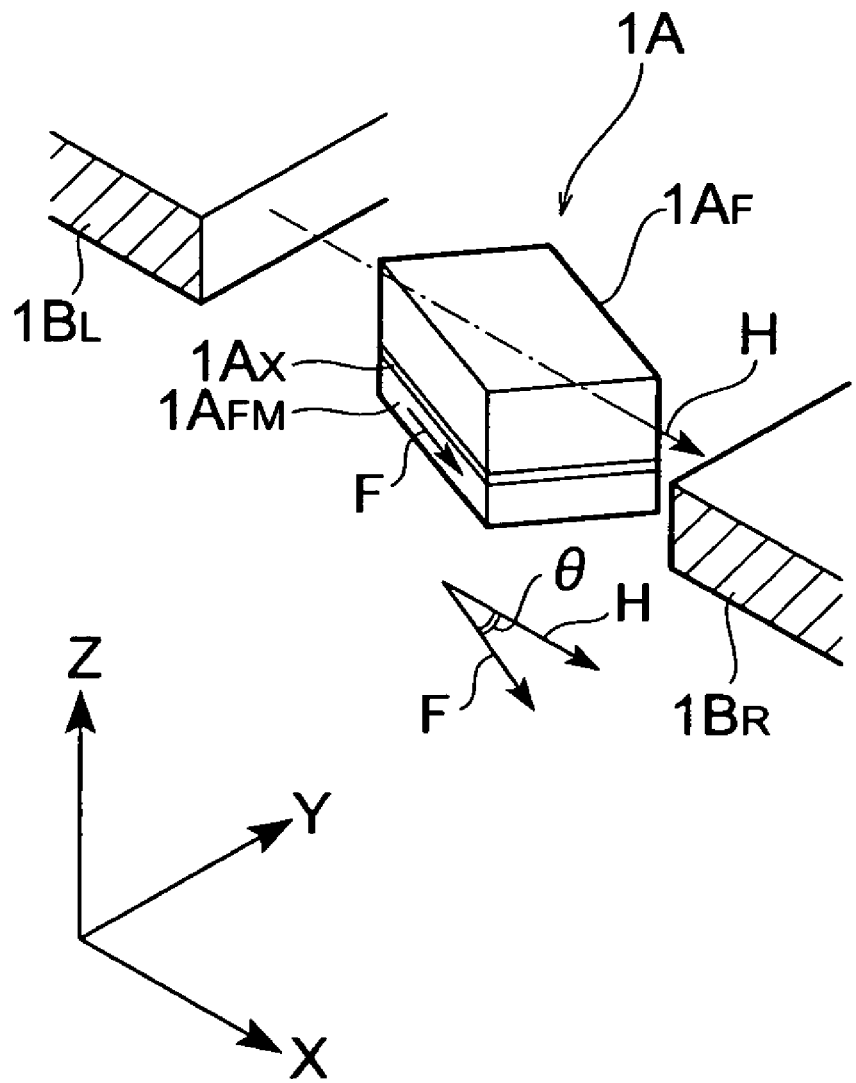
FIG. 2 is an enlarged perspective view of a part near a free layer $1A_F$ of a magnetoresistive element 1A.

FIG. 1 is a perspective view of a frequency analyzer 100 provided with a magnetic device 1 according to the present invention. FIG. 2 is an enlarged perspective view of a part near a free layer $1A_F$ of a magnetoresistive element 1A.

The magnetoresistive element 1A of this example is assumed to be a TMR element. The magnetic device 1 has the magnetoresistive element 1A, a magnetic yoke 1B arranged to apply a magnetic field to the magnetoresistive element 1A, a magnetic-field applying interconnection 1C for applying the magnetic field to the free layer $1A_F$ of the magnetoresistive element 1A through the magnetic yoke 1B, a pair of input terminals INPUT1, INPUT2 for supplying an alternating-current signal between two ends of the magnetoresistive element 1A, a pair of output terminals OUTPUT1, OUTPUT2 for extracting an output voltage V between the two ends of the magnetoresistive element 1A, and a current control circuit 1D for controlling a direct current (control current) I flowing through the magnetic-field applying interconnection 1C. The input terminal INPUT2 and the output terminal OUTPUT2 are reference terminals VREF and are connected to the ground.

The thickness direction of the magnetoresistive element 1A is defined as a Z-axis direction, and two axes orthogonal thereto are defined as an X-axis and a Y-axis, respectively. The magnetic-field applying interconnection 1C extends along the Y-axis and is located in the space between the magnetoresistive element 1A and a top magnet $1B_{TOP}$ of the magnetic yoke 1B. An upper electrode (interconnection) $1A_U$ and a lower electrode (interconnection) $1A_L$ are in contact with the two ends in the Z-axis direction of the magnetoresistive element 1A, respectively, and are electrically connected to the magnetoresistive element 1A. The upper electrode $1A_U$ and the lower electrode $1A_L$ both extend along the Y-axis direction. The upper electrode $1A_U$ is located in the space between the magnetoresistive element 1A and the magnetic-field applying interconnection 1C.

The magnetic yoke 1B has the top magnet $1B_{TOP}$, lower magnets $1B_{LOW}$, and middle magnets $1B_M$ being continuous to the top magnet $1B_{TOP}$ and the lower magnets $1B_{LOW}$ and connecting them; a pair of bottom magnets $1B_L$, $1B_R$ are in contact with the lower surfaces of the lower magnets $1B_{LOW}$; and the bottom magnets $1B_L$, $1B_R$ extend along the X-axis direction toward the free layer $1A_F$ of the magnetoresistive element 1A. The terms "upper" and "lower" mean a location on the positive side and a location on the negative side, respectively, on the Z-axis and are irrespective of directions of gravity.

An alternating-current signal is applied from a signal source S through the input terminals INPUT1, INPUT2, between the upper electrode $1A_U$ and the lower electrode $1A_L$. A capacitor C is inserted in series in an interconnection between one input terminal INPUT1 and the upper electrode $1A_U$, in order to prevent a direct current from being applied between the upper electrode $1A_U$ and the lower electrode $1A_L$.

When an alternating current i is applied to the magnetoresistive element 1A, spins of a specific polarity are injected into the free layer $1A_F$ of the magnetoresistive element 1A and the direction of magnetization of the free layer $1A_F$ varies according to an amount of spins injected. The direction of magnetization of the free layer $1A_F$ is aligned with a direction F of magnetization of a fixed layer $1A_{FM}$, or is perpendicular to the direction F of magnetization of the fixed layer $1A_{FM}$ in the XY plane. When polarized spins are injected from the fixed layer $1A_{FM}$ side of the magnetoresistive element 1A into the free layer $1A_F$, spins of a polarity in the direction aligned with the direction F of magnetization of the fixed layer are injected into the free layer $1A_F$; when electrons are injected in the direction opposite thereto, into the free layer $1A_F$, spins of the polarity aligned with the direction of magnetization of the fixed layer $1A_{FM}$ are not injected into the free layer $1A_F$, but spins of the opposite polarity to the above are injected into the free layer $1A_F$, so as to cause magnetization reversal by virtue of interaction with spins in the free layer $1A_F$.

Since the polarities of the alternating current i change with time, the direction of magnetization of the free layer $1A_F$ oscillates as affected by the magnitude and frequency of the alternating current i. When the frequency $f_F$ of the magnetization direction of the free layer $1A_F$ in the magnetoresistive element 1A coincides with the frequency f of the alternating current i flowing in the magnetoresistive element 1A ($f_0 = f_F = f$), the oscillation of the magnetization direction of the free layer $1A_F$ resonates, whereupon the magnetic resistance R of the magnetoresistive element 1A rapidly varies and the voltage increases between the output terminals OUTPUT1, OUTPUT2. The resonance frequency $f_0$ increases depending upon the strength of the magnetic field H applied to the free layer $1A_F$ of the magnetoresistive element 1A.

The strength of the magnetic field H increases depending upon the electric current I flowing through the magnetic-field applying interconnection 1C. Namely, the magnetic field is generated so as to surround the electric current I flowing through the magnetic-field applying interconnection 1C, but this magnetic field is also generated in the space between the bottom magnets $1B_L$, $1B_R$, while passing through the interior of the magnetic yoke 1B. Since the free layer $1A_F$ is located in this space, the free layer $1A_F$ is steadily located in the constant magnetic field H. However, the strength of the magnetic field H is appropriately changed by the electric current I supplied from the current control circuit 1D.

Figure 5:
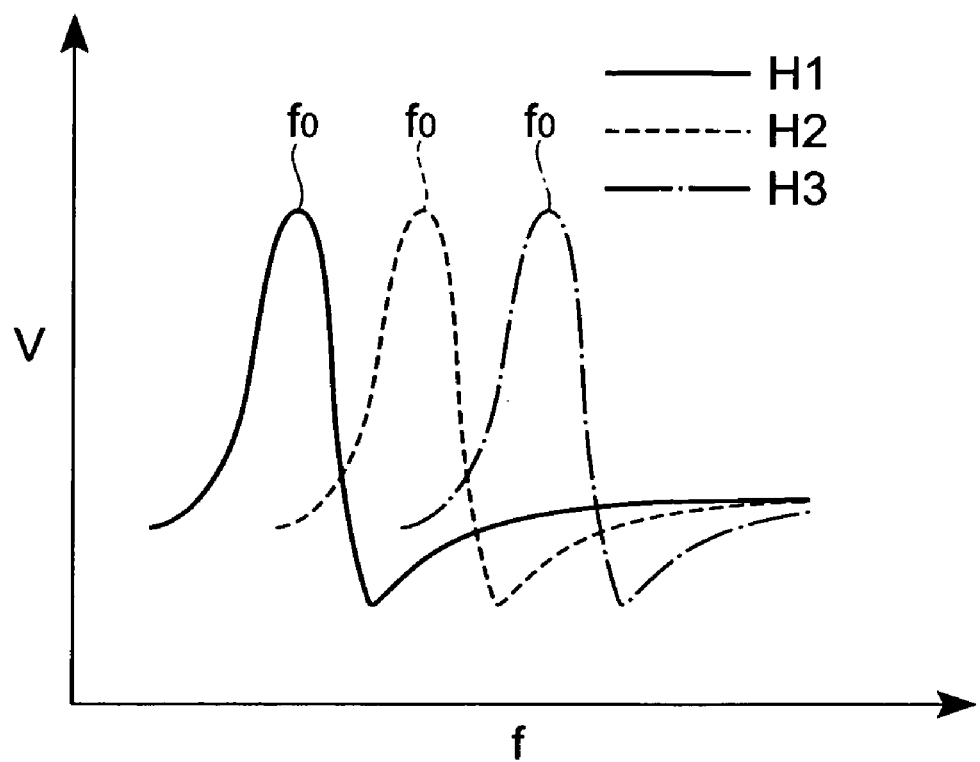
FIG. 5 is a graph showing the relationship between frequency f of alternating current i and output voltage V.

Therefore, as the electric current I flowing through the magnetic-field applying interconnection 1C is increased by the current control circuit 1D, the strength of the magnetic field H increases (H1<H2<H3) and the resonance frequency $f_0$ increases (cf. FIG. 5). Namely, the resonance frequency $f_0$ is determined depending upon the electric current I for application of magnetic field, and a voltage V corresponding to a component of a determined resonance frequency $f_0$, among the input alternating-current signal (alternating current i), selectively appears between the output terminals OUTPUT1, OUTPUT2 (cf. FIG. 6).

The frequency analyzer 100 of the present embodiment has the magnetic device 1 and further has a monitor circuit 2 for monitoring the voltage V outputted from the output terminals OUTPUT1, OUTPUT2, while sweeping the direct current I outputted from the current control circuit 1D. The sweeping of the direct current I can be implemented, for example, by a ramp circuit, and this may be incorporated in the current control circuit 1D. As the direct current is used as the electric current I outputted from the current control circuit 1D, while the magnitude of this direct current I is swept, the voltage V at each specific resonance frequency is detected by the monitor circuit 2 (cf. FIG. 6). Namely, spectra are obtained at respective specific frequencies included in the alternating-current signal i, and this device functions as a frequency analyzer.

As described above, the magnetic device 1 of this example is arranged to control the electric current I flowing through the magnetic-field applying interconnection 1C, thereby changing the resonance frequency of the magnetoresistive element 1A with the input alternating-current signal. It was confirmed that the resonance frequency was controlled by control of the electric current (control current) flowing through the magnetic-field applying interconnection 1C. In the present example, a specific frequency can be selected by the control current. In other words, this magnetic device 1 is a device that selects a specific frequency component included in the alternating-current signal, by controlling the electric current flowing through the magnetic-field applying interconnection 1C.

The magnetic device 1 is arranged to time-sequentially change the electric current flowing through the magnetic-field applying interconnection 1C and thereby time-sequentially output direct-current voltages corresponding to a plurality of specific frequency components included in the alternating-current signal. As described below, the control current I was found to be proportional to the resonance frequency. Namely, as the control current I is linearly increased or decreased by a ramp circuit or the like, direct-current voltages V corresponding to respective frequency components can be time-sequentially outputted.

The frequency analyzer 100 further has a low-pass filter L interposed between the monitor circuit 2 and the magnetoresistive element 1A. This is for selectively extracting only the direct-current voltage V according to the magnetic resistance (resonance frequency) of the magnetoresistive element 1A from the output terminals OUTPUT1, OUTPUT2, because the pair of input terminals INPUT1, INPUT2 and the pair of output terminals OUTPUT1, OUTPUT2 are connected between the two ends of the magnetoresistive element 1A and the alternating-current signal i is applied to the input terminals INPUT1, INPUT2. The low-pass filter L transmits only the direct current component from the magnetoresistive element 1A and feeds it to the monitor circuit 2. In the present example, the low-pass filter L is composed of a coil interposed between the upper electrode $1A_U$ and the output terminal OUTPUT1.

For oscillating the direction of magnetization of the free layer $1A_F$, it is preferable that the direction of the magnetic field H along the X-axis at the position of the free layer $1A_F$ should not coincide with the direction F of magnetization of the fixed layer $1A_{FM}$. Namely, when they coincide, it becomes difficult to induce the oscillation of the magnetization direction of the free layer $1A_F$ associated with the direction F of magnetization of the fixed layer $1A_{FM}$. When the axis of easy magnetization of the free layer $1A_F$ is set in parallel with the magnetization direction F of the fixed layer $1A_{FM}$, a relative relation between the direction F of magnetization of the fixed layer $1A_{FM}$ and the direction H of the magnetic field by the magnetic yoke 1B coincides with a relative relation between the direction of magnetization along the easy magnetization axis of the free layer $1A_F$ and the direction of the magnetic field by the magnetic yoke 1B. When the axis of easy magnetization of the free layer $1A_F$ is set perpendicularly to the direction F of magnetization of the fixed layer $1A_{FM}$, the direction of the magnetic field H by the magnetic yoke 1B deviates from the stable easy magnetization axis of the magnetization direction of the free layer $1A_F$, and it is thus also feasible to readily induce the oscillation of the magnetization direction of the free layer $1A_F$.

In the magnetic device 1 of the present invention, a relative location relation between the magnetic yoke 1B and the magnetization direction of the fixed layer $1A_{FM}$ is determined so that the direction H of the magnetic field applied to the magnetoresistive element 1A by the magnetic yoke 1B intersects at an angle θ of not less than 5° in the film plane (XY plane), with the direction F of magnetization of the fixed layer $1A_{FM}$. The film plane is defined by a surface of each layer.

If the direction H of the magnetic field applied to the free layer $1A_F$ by the magnetic yoke 1B is off the film plane, "not less than 5°" means that an angle θ between a projection vector on the film plane of the direction H of this magnetic field and the direction F of magnetization of the fixed layer $1A_{FM}$ is not less than 5° in the film plane.

The above-described magnetic device 1 is able to implement detection of GHz-band frequencies which cannot be achieved by the ordinary Si semiconductor technology. Therefore, it becomes feasible to realize industrial application of the magnetic device 1. Particularly, the magnetic yoke 1B is provided in place of the conventional large-scale magnetic-field applying device and thus achieves downsizing of the magnetic device 1. In addition, the magnetic yoke 1B can significantly decrease the electric current I for application of magnetic field. Furthermore, it suppresses leakage of the magnetic field to the outside and thus prevents influence on an adjacent element.

The magnetic yoke 1B is formed as follows: after formation of the magnetoresistive element 1A, the bottom magnetic layers $1B_L$, $1B_R$ are laid through an insulating layer on the lower electrode $1A_L$; then another insulating layer is laid only on the magnetoresistive element 1A, subsequently the magnetic-field applying interconnection 1C is formed on the insulating layer; still another insulating layer is deposited to bury the magnetic-field applying interconnection 1C in this insulating layer; thereafter, the lower magnets $1B_{LOW}$, middle magnets $1B_M$, and top magnet $1B_{TOP}$ are successively laid so as to be in contact with the bottom magnetic layers $1B_L$, $1B_R$. The deposition of these can be implemented by sputtering or the like, and an appropriate photoresist can be used for setting of each deposited region.

Figure 3:
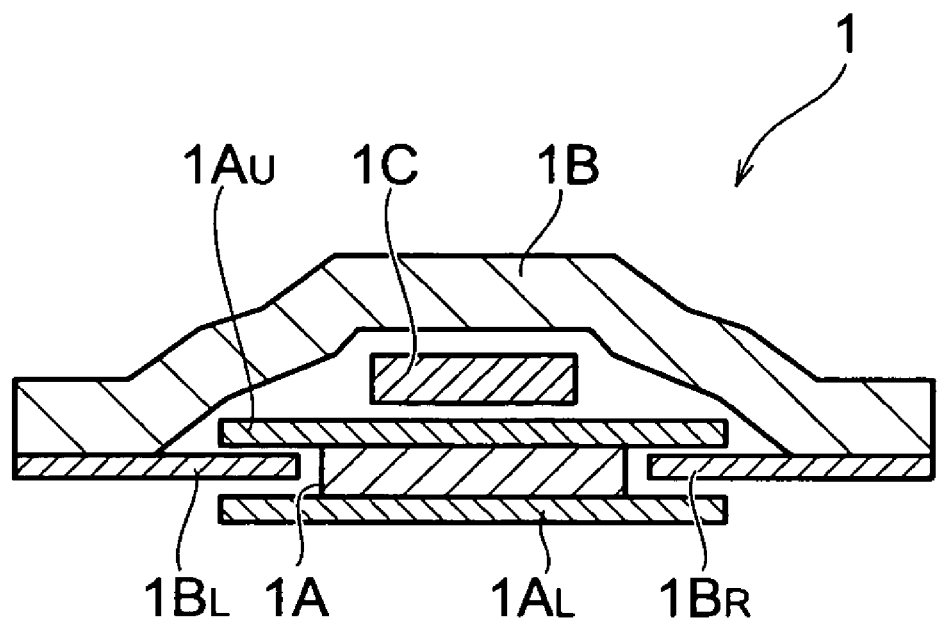
FIG. 3 is a sectional view along line III-III and in a direction of arrows of the magnetic device 1 shown in FIG. 1.

FIG. 3 is a sectional view along line III-III and in the direction of arrows of the magnetic device 1 shown in FIG. 1.

The magnetic yoke 1B surrounds the magnetic-field applying interconnection 1C, the upper electrode $1A_U$, and the magnetoresistive element 1A. The magnetic yoke 1B is provided around the magnetoresistive element 1A and has a shape partially surrounding it, but it is also possible to adopt the magnetic yoke 1B of a shape completely surrounding the magnetoresistive element 1A, as long as it is formed in the structure in which the magnetic field H is applied to the magnetoresistive element 1A. Magnetic lines of the magnetic field H generated by the electric current flowing through the magnetic-field applying interconnection 1C pass through the interior of the magnetic yoke 1B consisting of a soft magnetic material, to enhance the intensity of the magnetic field H between the bottom magnets $1B_L$, $1B_R$. The magnetic yoke 1B is made of a soft magnetic ferromagnet as the free layer $1A_F$ is.

The structure of the magnetoresistive element 1A can be any well-known one, and there are no particular restrictions thereon. The structure of the magnetoresistive element 1A will be described bellow.

Figure 4:
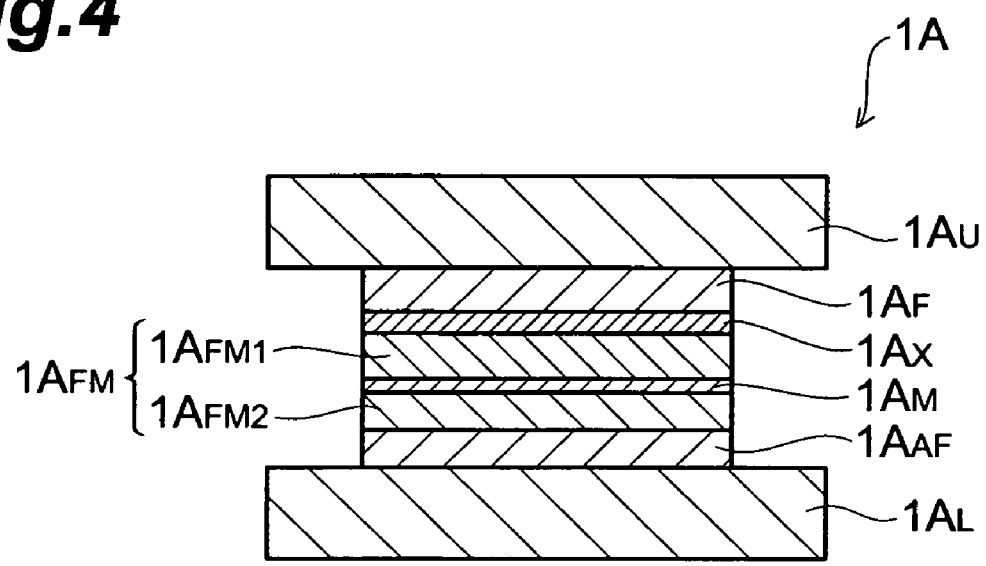
FIG. 4 is a vertical sectional view of the magnetoresistive element 1A.

FIG. 4 is a vertical sectional view of the magnetoresistive element 1A.

The magnetoresistive element 1A is an element including the free layer $1A_F$. Specifically, the magnetoresistive element 1A is comprised of a first magnetic layer being a magnetosensitive layer of a ferromagnet (free layer $1A_F$), a pair of ferromagnetic layers (fixed layers: pinned layers) $1A_{FM}$ ($1A_{FM1}$, $1A_{FM2}$) with opposite magnetization directions fixed through a nonmagnetic layer $1A_M$ consisting of an electroconductive metal such as Cu, an antiferromagnetic layer $1A_{AF}$ exchange-coupled with the lower ferromagnetic layer $1A_{FM2}$, and a nonmagnetic layer $1A_X$ interposed between the free layer $1A_F$ and the fixed layer $1A_{FM}$. The directions of magnetization of the ferromagnetic layers $1A_{FM1}$, $1A_{FM2}$ are along directions normal to the thickness direction Z.

When the magnetoresistive element 1A is composed of a TMR element, the nonmagnetic layer $1A_X$ is assumed to be a nonmagnetic insulating layer (tunnel barrier layer: the appropriate thickness of which is not more than 1 nm); when the magnetoresistive element 1A is comprised of a CPP (Current Perpendicular Plane) type GMR element, the nonmagnetic layer $1A_X$ is composed of a nonmagnetic electroconductive layer such as Cu. In either structure, the electric current flows perpendicularly to the film plane and the resonance phenomenon suitably occurs with these elements.

These layers are successively laid on the lower electrode $1A_L$. The ferromagnetism is a magnetic property of a substance in which adjacent spins are aligned in the same direction to yield a large magnetic moment as a whole, and a ferromagnet has spontaneous magnetism even in the absence of an external magnetic field. Materials ferromagnetic at room temperature include Fe, Co, Ni, and Gd. The ferromagnets suitably applicable include Co, Ni—Fe alloys, Co—Fe alloys, and so on. The antiferromagnet making up the antiferromagnetic layer $1A_{AF}$ can be FeMn, IrMn, PtMn, NiMn, or the like. When the nonmagnetic layer $1A_X$ is composed of an insulating layer for TMR element, the insulating layer applicable is a tunnel barrier layer such as MgO, $Al_2O_3$, or TiO in a thickness to cause the tunnel effect.

The aforementioned frequency separation will be further described below.

FIG. 5 is a graph showing the relationship between frequency f of alternating current i and output voltage V.

As the frequency f of the alternating current i increases, the magnetic field to provide the frequency $f_0$ resonating with this frequency f increases as H1, H2, and H3 (H1<H2<H3). When the magnetic field is constant, the voltage V has a peak at a specific resonance frequency $f_0$.

Figure 6:
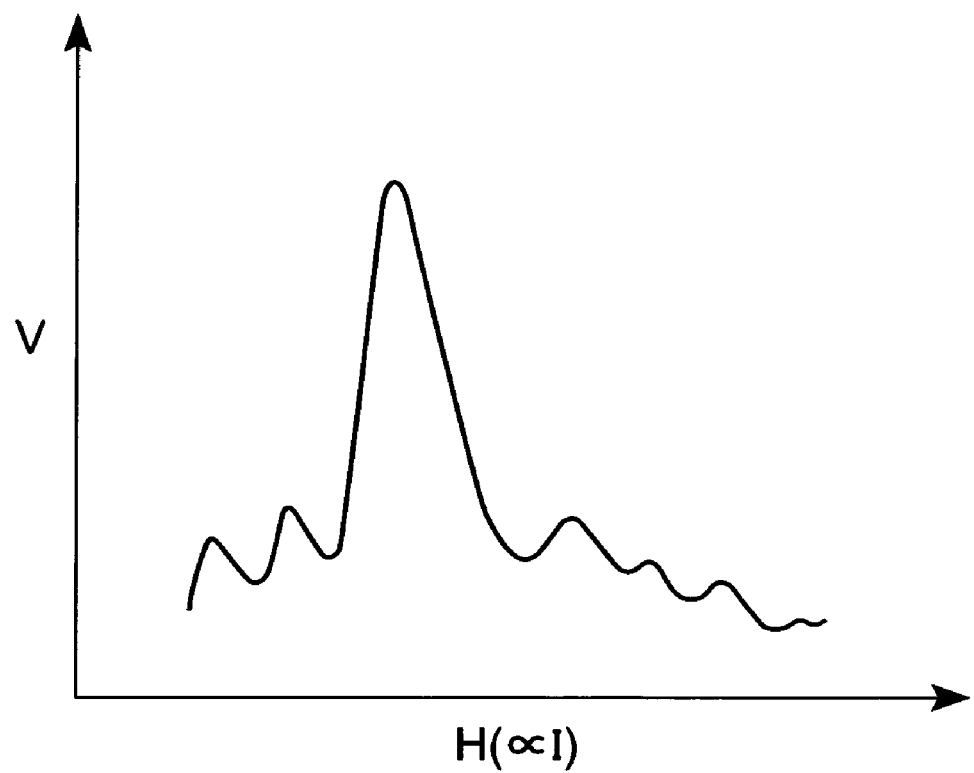
FIG. 6 is a graph showing the relationship between magnetic field H and voltage V.

FIG. 6 is a graph showing the relationship between magnetic field H and voltage V.

The alternating current i is, for example, a signal used in fast communication and includes various frequency components. When the specific frequency component is large, the magnitude of the voltage V becomes higher in the magnetic field to provide the frequency resonating with the specific frequency component. It is needless to mention that when the specific frequency component is small, the magnitude of the voltage V becomes smaller in the magnetic field to provide the frequency resonating therewith. Namely, the magnitude of the input alternating current i is separated frequency by frequency and is monitored by the monitor circuit 2 shown in FIG. 1.

Figure 7:
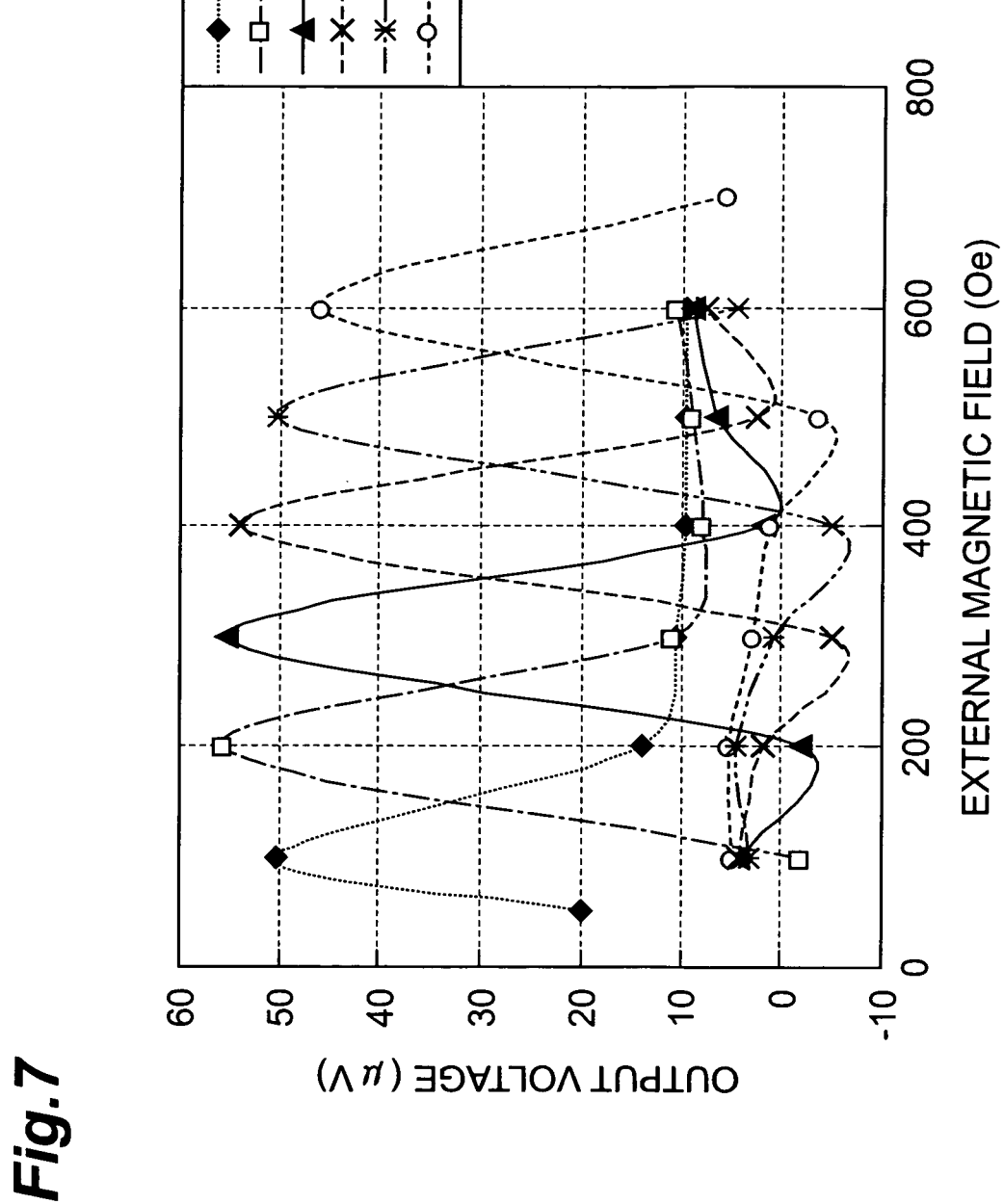
FIG. 7 is a graph showing the relationship between external magnetic field (Oe) and output voltage (μV) at each of frequencies (GHz) of an input high-frequency signal in a case where the magnetoresistive element 1A shown in FIG. 1 is a TMR element.

FIG. 7 is a graph showing the relationship between external magnetic field (Oe) and output voltage (μV), at each of frequencies (GHz) of the input high-frequency signal in a case where the magnetoresistive element 1A shown in FIG. 1 is a TMR element, and FIG. 8 is a table showing data in the graph of FIG. 7, in which numerical values in the table except for the uppermost row and the leftmost column indicate output voltages (μV).

It is apparent from this graph that there is the strength of the external magnetic field corresponding to the resonance frequency and the external magnetic field required becomes stronger with increase in the frequency. The external magnetic field is proportional to the magnitude of the control current flowing through the magnetic-field applying interconnection 1C.

Figure 9:
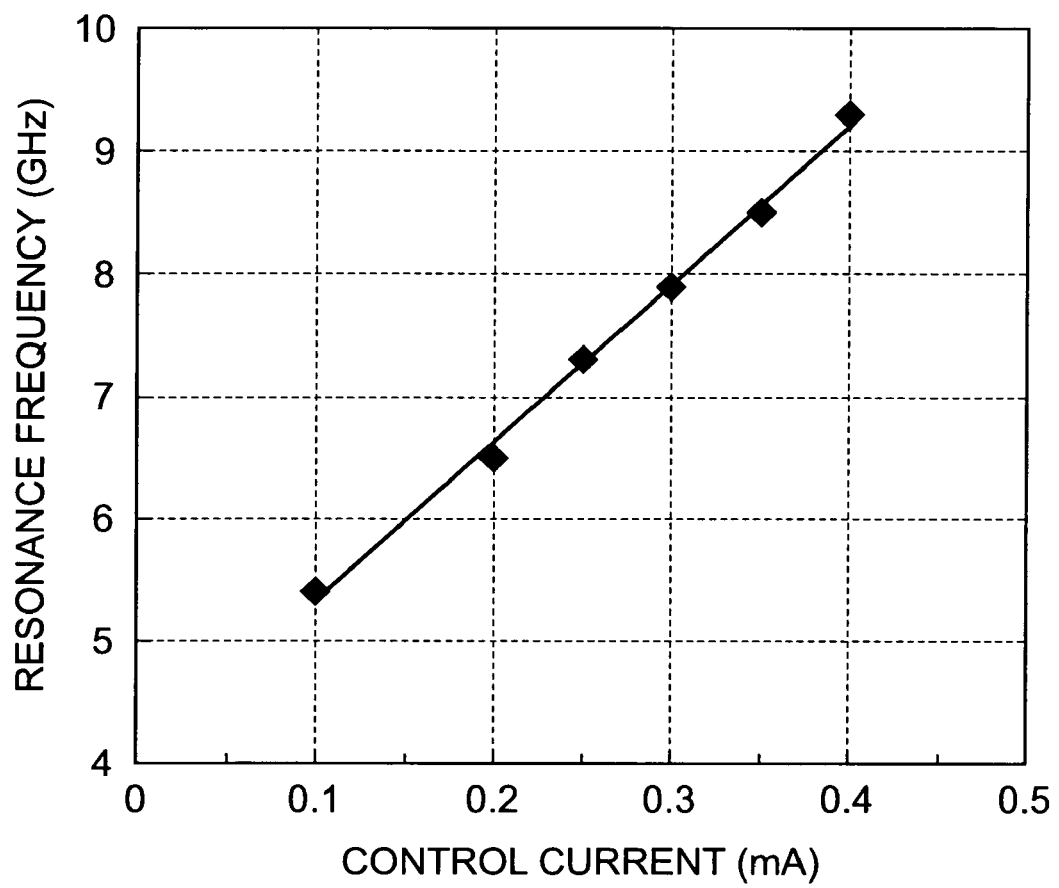
FIG. 9 is a graph showing the relationship between control current (mA) and resonance frequency (GHz).

FIG. 9 is a graph showing the relationship between this control current (mA) and resonance frequency (GHz), and FIG. 10 is a table showing data in the graph shown in FIG. 9.

It is seen that the resonance frequency linearly increases with increase in the control current. Namely, the control current is proportional to the resonance frequency. This verified that the resonance frequency can be readily selected by control of the control current.

When a CPP type GMR element is used instead of the TMR element, it also acts similarly as the TMR element in accordance with oscillation of the magnetization direction, in view of the principle of resonance of spin oscillation. Similar experiments were conducted with the CPP type GMR element, and the results obtained were the same as in the case of the TMR element. Namely, for example, when the frequency of the applied voltage was 4.5 GHz, a peak of the output voltage was observed at 4.5 GHz and the voltage value observed was over 230 μV.

As described above, the GHz-band frequency analysis can be implemented by making use of the resonance of the spin device, and further development can be expected in the communication technology.

What is claimed is:

1. A frequency detector comprising:
  a magnetic device comprising:
    a magnetoresistive element, wherein a thickness direction of the magnetoresistive element is defined as a Z-axis direction, and two axes orthogonal thereto are defined as an X-axis and a Y-axis, respectively;
    an upper electrode and a lower electrode being in contact with the two ends in the Z-axis direction of the magnetoresistive element, respectively, and being electrically connected to the magnetoresistive element, wherein the upper electrode and the lower electrode both extend along the Y-axis direction;
    a magnetic yoke arranged to apply a magnetic field to the magnetoresistive element, and left and right side walls of the magnetic yoke having gradual slopes to form a trapezoidal space in a cross-section of the magnetic yoke to enhance intensity of the magnetic field;
    a magnetic-field applying interconnection for applying the magnetic field through the magnetic yoke to the magnetoresistive element;
      wherein the magnetic-field applying interconnection is positioned above the magnetoresistive element via a gap,
      wherein the magnetic-field applying interconnection extends along the Y-axis and is located in the trapezoidal space between the magnetoresistive element and a top magnet of the magnetic yoke, and the magnetic-field applying interconnection is surrounded by the magnetic yoke; and
      wherein the upper electrode is located in the trapezoidal space between the magnetoresistive element and the magnetic-field applying interconnection;
  an input terminal for supplying an alternating-current signal to the magnetoresistive element;
  an output terminal for extracting an output voltage from the magnetoresistive element; and
  a current control circuit for controlling an electric direct current flowing through the magnetic-field applying interconnection to sweep the direct current flowing in the magnetic-field applying interconnection; and
  a monitor circuit for monitoring the voltage outputted from the output terminal, while sweeping the direct current outputted from the current control circuit.

2. The frequency detector according to claim 1, wherein the magnetoresistive element comprises:
  a fixed layer;
  a free layer; and
  a nonmagnetic layer interposed between the fixed layer and the free layer;
    wherein the alternating-current signal flows in a direction normal to a film plane of the magnetoresistive element.

3. The frequency detector according to claim 2, wherein a relative location relation between the magnetic yoke and a direction of magnetization of the fixed layer is determined so that a direction of the magnetic field applied to the magnetoresistive element by the magnetic yoke intersects at an angle of not less than 5° in the film plane, with the direction of magnetization of the fixed layer.

4. The frequency detector according to claim 1, wherein a resonance frequency of the magnetoresistive element with the alternating-current signal is changed by controlling the electric current flowing through the magnetic-field applying interconnection.

5. The frequency detector according to claim 1, wherein a specific frequency component in the alternating-current signal is selected by controlling the electric current flowing through the magnetic-field applying interconnection.

6. The frequency detector according to claim 1, wherein direct-current voltages corresponding to a plurality of specific frequency components in the alternating-current signal are time-sequentially outputted by time-sequentially changing the electric current flowing through the magnetic-field applying interconnection.

7. The frequency detector according to claim 1, further comprising a low-pass filter interposed between the monitor circuit and the magnetoresistive element.

* * * * *